US008987820B1

(12) United States Patent
Lee et al.

(10) Patent No.: US 8,987,820 B1
(45) Date of Patent: Mar. 24, 2015

(54) LATERAL DOUBLE DIFFUSED METAL-OXIDE-SEMICONDUCTOR DEVICE AND METHOD FOR FABRICATING THE SAME

(71) Applicant: Vanguard International Semiconductor Corporation, Hsinchu (TW)

(72) Inventors: Tsung-Hsiung Lee, Taoyuan (TW); Jui-Chun Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/052,075

(22) Filed: Oct. 11, 2013

(51) Int. Cl.
*H01L 21/336* (2006.01)
*H01L 21/365* (2006.01)
*H01L 21/8232* (2006.01)
*H01L 29/66* (2006.01)
*H01L 29/78* (2006.01)
*H01L 29/772* (2006.01)
*H01L 29/423* (2006.01)
*H01L 29/04* (2006.01)
*H01L 29/94* (2006.01)
*H01L 29/76* (2006.01)

(52) U.S. Cl.
CPC ...... *H01L 29/7816* (2013.01); *H01L 29/66681* (2013.01)
USPC .... 257/343; 257/335; 257/340; 257/E29.256; 257/E21.417; 257/E27.016; 438/197; 438/533

(58) Field of Classification Search
CPC .............. H01L 2924/00; H01L 29/41766; H01L 29/7835; H01L 29/402; H01L 29/4175; H01L 29/7802; H01L 29/407; H01L 29/1095; H01L 29/0634; H01L 29/7813; H01L 29/41741; H01L 29/66659; H01L 29/7806; H01L 29/41775; H01L 29/7816; H01L 29/66681
USPC ................................................. 257/335–350
See application file for complete search history.

(56) References Cited

U.S. PATENT DOCUMENTS

| | | | | |
|---|---|---|---|---|
| 7,745,846 B2 * | 6/2010 | Korec et al. | | 257/155 |
| 7,952,145 B2 * | 5/2011 | Korec et al. | | 257/343 |
| 8,120,106 B2 * | 2/2012 | Hsieh | | 257/336 |
| 8,174,070 B2 * | 5/2012 | Mallikarjunaswamy | | 257/341 |
| 8,222,694 B2 * | 7/2012 | Hebert | | 257/337 |
| 8,330,186 B2 * | 12/2012 | Darwish et al. | | 257/141 |
| 2007/0034944 A1 * | 2/2007 | Xu et al. | | 257/335 |
| 2008/0246086 A1 * | 10/2008 | Korec et al. | | 257/343 |
| 2012/0273878 A1 * | 11/2012 | Mallikarjunaswamy | | 257/335 |
| 2012/0273879 A1 * | 11/2012 | Mallikarjunaswamy et al. | | 257/335 |

* cited by examiner

*Primary Examiner* — Howard Weiss
*Assistant Examiner* — Nelson Garces
(74) *Attorney, Agent, or Firm* — Birch, Stewart, Kolasch & Birch, LLP

(57) ABSTRACT

A LDMOS device includes a substrate having opposite first and second surfaces; a well region in a portion of the substrate; a gate structure over a portion of the substrate; a first doped region disposed in a portion of the well region from a first side; a second doped region disposed in the well region from a second side; a third doped region disposed in the first doped region; a fourth doped region disposed in the second doped region; a first trench in the third doped region, the first doped region, the well region, and the substrate adjacent to the first surface; a conductive contact in the first trench; a second trench in the substrate adjacent to the second surface; a first conductive layer in second trench; and a second conductive layer over the second surface of the substrate and the first conductive layer.

10 Claims, 4 Drawing Sheets

US 8,987,820 B1

LATERAL DOUBLE DIFFUSED METAL-OXIDE-SEMICONDUCTOR DEVICE AND METHOD FOR FABRICATING THE SAME

BACKGROUND OF THE INVENTION

1. Field of the Invention

The present invention relates to integrated circuit (IC) devices, and in particular to a lateral double diffused metal-oxide-semiconductor (LDMOS) device and a method for fabricating the same.

2. Description of the Related Art

Recently, due to the rapid development of communication devices such as mobile communication devices and personal communication devices, wireless communication products such as mobile phones and base stations have been developed greatly. In wireless communication products, high-voltage elements of lateral double diffused metal-oxide-semiconductor (LDMOS) devices are often used as radio frequency (900 MHz-2.4 GHz) related elements therein.

LDMOS devices not only have a higher operation frequency, but they are also capable of sustaining a higher breakdown voltage, thereby having a high output power so that they can be used as power amplifiers in wireless communication products. In addition, due to the fact that LDMOS devices can be formed by conventional CMOS fabrications, LDMOS devices can be fabricated from a silicon substrate which is relatively cost-effective and employs mature fabrication techniques.

In FIG. 1, a schematic cross section showing a conventional N-type lateral double diffused metal-oxide-semiconductor (LDMOS) device applicable in a radio frequency (RF) circuit element is illustrated. As shown in FIG. 1, the N-type LDMOS device mainly comprises a P+ type semiconductor substrate 100, a P− type epitaxial semiconductor layer 102 formed over the P+ type semiconductor substrate 100, and a gate structure G formed over a portion of the P− type epitaxial semiconductor layer 102. A P− type doped region 104 is disposed in the P− type epitaxial semiconductor layer 102 under the gate structure G and a portion of the P− type epitaxial semiconductor layer 102 under the left side of the gate structure G, and a N− type drift region 106 is disposed in a portion of the P− type epitaxial semiconductor layer 102 under the right side of the gate structure G. A P+ type doped region 130 and a N+ type doped region 110 are disposed in a portion of the P type doped region 104, and the P+ doped region 130 partially contacts a portion of the N+ type doped region 110, thereby functioning as a contact region (e.g. P+ type doped region 130) and a source region (e.g. N+ type doped region 110) of the N type LDMOS device, respectively, and another N+ type doped region 108 is disposed in a portion of the P− type epitaxial semiconductor layer 102 at the right side of the N− type drift region 106 to function as a drain region of the N type LDMOS device. In addition, an insulating layer 112 is formed over the gate structure G, covering sidewalls and a top surface of the gate structure G and partially covering the N+ type doped regions 108 and 110 adjacent to the gate structure G. Moreover, the N type LDMOS further comprises a P+ type doped region substantially disposed in a portion of the P− type epitaxial semiconductor layer 102 under the N+ type doped region 110 and the P− type doped region 104 under the N+ type doped region 110. The P+ type doped region 120 physically connects the P− type doped region 104 with the P+ type semiconductor substrate 100.

During operation of the N type LDMOS device shown in FIG. 1, due to the formation of the P+ type doped region 120, currents (not shown) from the drain side (e.g. N+ type doped region 108) laterally flow through a channel (not shown) underlying the gate structure G towards a source side (e.g. N+ type doped region 110), and are then guided by the P− type doped region 104 and the P+ type doped region 120, thereby arriving the P+ type semiconductor substrate 100, such that problems such as inductor coupling and cross-talk between adjacent circuit elements can be avoided. However, formation of the P+ type doped region 120 needs to perform ion implantations of high doping concentrations and high doping energies and thermal diffusion processes with a relatively high temperature above about 900° C., and a predetermined distance D1 is kept between the gate structure G and the N+ type doped region 110 at the left side of the gate structure G to ensure good performance of the N type LDMOS device. Therefore, formation of the P+ type doped region 120 and the predetermined distance D1 kept between the gate structure G and the N+ type doped region 110 increase the on-state resistance (Ron) of the N type LDMOS device and a dimension of the N type LDMOS device, which is unfavorable for further reduction of both the fabrication cost and the dimensions of the N type LDMOS device.

BRIEF SUMMARY OF THE INVENTION

Accordingly, an improved lateral double diffused metal oxide semiconductor (LDMOS) device and method for fabricating the same are provided to reduce size and fabrication cost.

An exemplary lateral double diffused metal oxide semiconductor (LDMOS) device comprises: a semiconductor substrate, having opposite first and second surfaces and a first conductivity type; a well region formed in a portion of the semiconductor substrate adjacent to the first surface thereof, having the first conductivity type; a gate structure disposed over a portion of the first surface of the semiconductor substrate; a first doped region disposed in a portion of the well region adjacent to a first side of the gate structure, having the first conductivity type; a second doped region disposed in a portion of the well region adjacent to a second side of the gate structure opposite to the first side, having a second conductivity type opposite to the first conductivity type; a third doped region disposed in a portion of the first doped region, having the second conductivity type; a fourth doped region disposed in a portion of the second doped region, having the second conductivity type; a first trench formed in a portion of the third doped region, the first doped region, the well region, and the semiconductor substrate; a conductive contact formed in the first trench; a second trench formed in a portion of the semiconductor substrate adjacent to the second surface thereof, wherein the second trench exposes a portion of the conductive contact; a first conductive layer formed in second trench, contacting the conductive contact; and a second conductive layer formed over the second surface of the semiconductor substrate and the first conductive layer.

An exemplary method for fabricating a lateral double diffused metal oxide semiconductor (LDMOS) device comprises: performing a semiconductor substrate, having opposite first and second surfaces and a first conductivity type; performing an ion implantation process, forming a well region in a portion of the semiconductor substrate adjacent to the first surface thereof, having the first conductivity type; forming a gate structure over a portion of the well region; forming a first doped region in a portion of the well region adjacent to a first side of the gate structure, having the first conductivity type; forming a second doped region in a portion of the well region at a second side of the gate structure opposite to the first side, having a second conductivity type opposite to the first conductivity type; forming a third doped region in a portion of the first doped region, having the second conductivity type; forming a fourth doped region in a portion of the second doped region, having the second conductivity type; forming a trench in a portion of the third doping region, the first doped region, the well region, and the semiconductor substrate; forming a conductive contact in the first trench; thinning the semiconductor substrate from the second surface thereof; after thinning the semiconductor substrate, forming a second trench in a portion of the semiconductor substrate adjacent to the second surface thereof, exposing a portion of the conductive contact; forming a first conductive layer in the second trench; and forming a second conductive layer over the second surface of the semiconductor substrate and the first conductive layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-6 are schematic cross sections showing a method for fabricating a lateral double diffused metal-oxide-semiconductor (LDMOS) device applicable for a radio frequency (RF) circuit element according to an embodiment of the invention.

Figure 2:
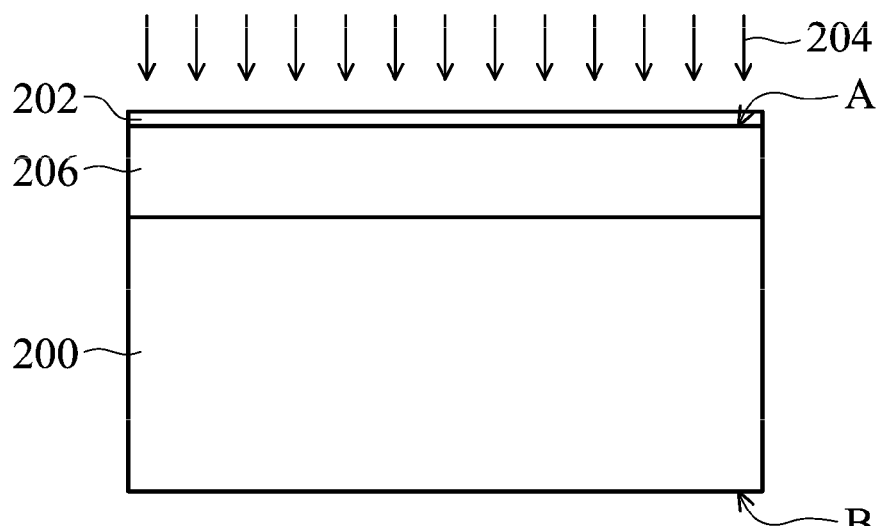
FIGS. 2-6 are schematic cross sections showing a method for fabricating a lateral double diffused metal-oxide-semiconductor (LDMOS) device according to an embodiment of the invention.

Referring to FIG. 2, a semiconductor substrate 200 such as a silicon substrate is first provided. In one embodiment, the semiconductor substrate 200 has a first conductivity type such as a P type conductivity, and a resistivity of about 5 ohms-cm ($\Omega$-cm)-15 ohms-cm ($\Omega$-cm). The semiconductor substrate 200 has opposing surfaces A and B. Next, a sacrificial layer 202 is formed over the surface A of the semiconductor substrate 202. In one embodiment, the sacrificial layer 202 may comprise materials such as silicon oxide and may be formed by a deposition process (not shown) such as thermal oxidation. Next, an ion implantation process 204 is performed to the semiconductor substrate 200 to implant dopants of the first conductivity type through the sacrificial layer 202 and into a portion of the semiconductor substrate 200, thereby forming a doped region 206. In one embodiment, the dopants of the first conductive type implanted by the ion implantation process 204 can be, for example, dopants of P-type conductivity.

Figure 3:
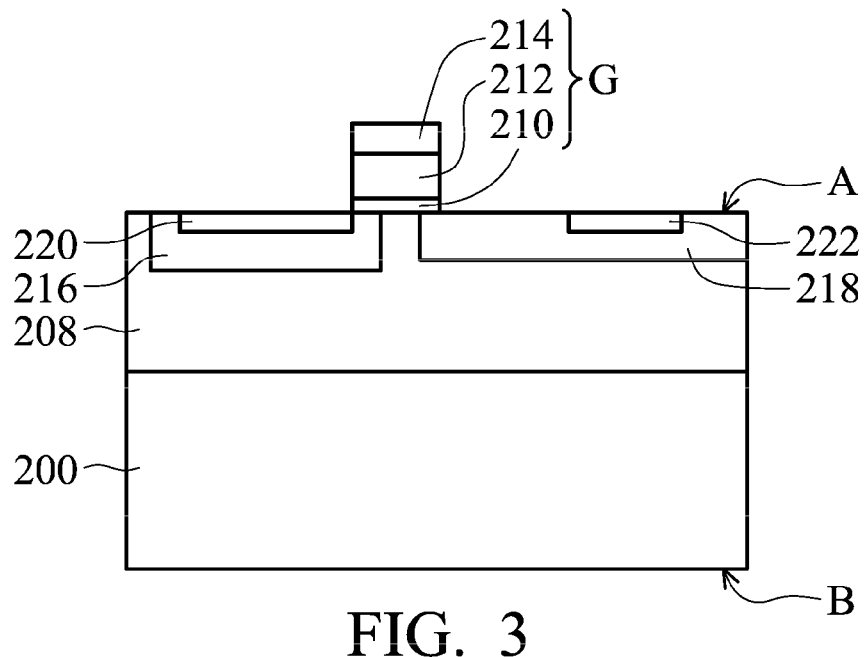

In FIG. 3, a thermal process (not shown) is performed to diffuse the dopants in the doped region 206, thereby forming a well region 208 in the semiconductor substrate 200. Herein, the well region 208 comprises dopants of the first conductivity type, and has a resistivity of about 0.5 ohms-cm ($\Omega$-cm)-1 ohms-cm ($\Omega$-cm). In one embodiment, the resistivity of the well region 208 is lower than the resistivity of the semiconductor substrate 200. Next, the sacrificial layer 202 over the surface A of the semiconductor substrate 200 is removed, and a patterned gate structure G is formed over a portion of the surface A of the semiconductor substrate 200. The gate structure G mainly comprises a gate dielectric layer 210, a gate electrode 212, and a hard mask layer 214 sequentially formed over a portion of the semiconductor substrate 200. The gate dielectric layer 210, the gate electrode 212, and the hard mask layer 214 of the gate structure G can be formed by conventional gate processes and related materials, and are not described here in detail for the purpose of simplicity. Next, a plurality of suitable masks (not shown) and a plurality of ion implant processes (not shown) are then performed to form a doped region 216 in a portion of the semiconductor substrate 200 at the left side of the gate structure G, and a doped region 218 in a portion of the semiconductor substrate 200 at the right side of the gate structure G. In one embodiment, the doped region 216 has a first conductivity type such as P type, and the doped region 218 has a second conductivity type such as N type opposite to the P type, and the ion implant processes (not shown) for forming the doped regions 216 and 218 can be ion implant processes with tilted implantation angles. Next, another suitable implant mask (not shown) and an ion implantation process (not shown) are performed to form a doped region 220 and a doped region 222 in a portion of the doped regions 216 and 218, respectively, on opposite sides of the gate structure G, and the configuration shown in FIG. 3 is formed after performing a thermal diffusion process (not shown). In one embodiment, the doped region 220 formed in a portion of the doped region 216 and the doped region 222 formed in a portion of the doped region 218 respectively has the second conductivity type, such as N type, and the ion implant process (not shown) for forming the doped regions 220 and 222 can be an ion implantation vertical to the surface A of the semiconductor substrate 200. In one embodiment, the doped region 218 may function as a drift region, and the doped regions 220 and 222 may function as source and drain regions, respectively.

Figure 4:
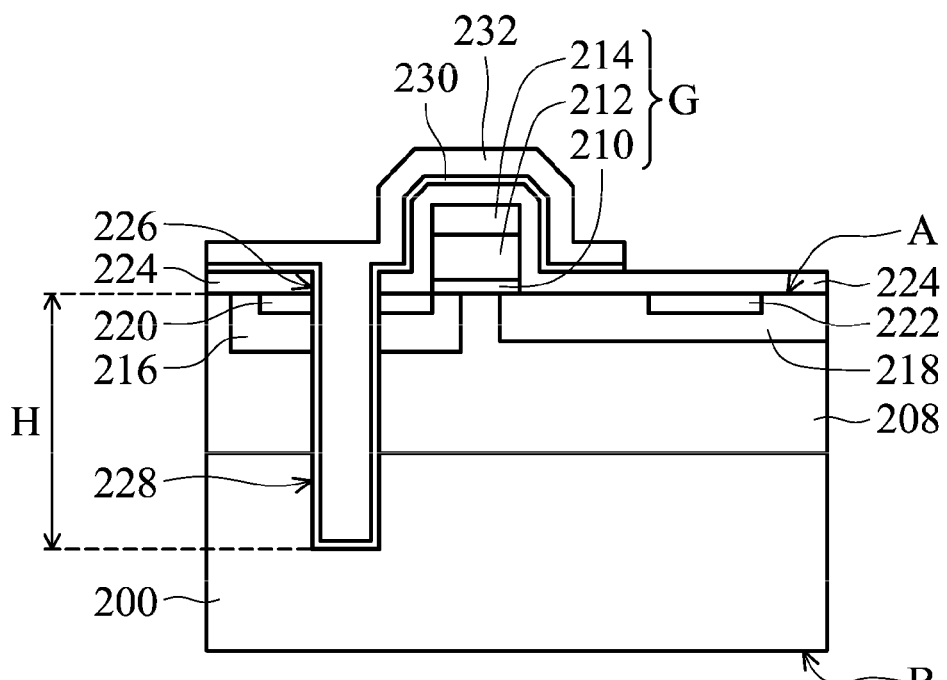

In FIG. 4, an insulating layer 224 is next formed over the semiconductor substrate 200, and the insulating layer 224 conformably covers the surface A of the semiconductor substrate 200 and a plurality of sidewalls and a top surface of the gate structure G formed thereover. Next, a patterning process (not shown) is performed to form an opening 226 in a portion of the insulating layer 224. As shown in FIG. 4, the opening 226 exposes a portion of the doped region 220 such that other portions of the semiconductor substrate 200 and surfaces of the gate structure G are still covered by the insulating layer 224. In one embodiment, the insulating layer 224 may comprise insulating materials such as silicon oxide and silicon nitride, and can be formed by a method such as chemical vapor deposition (CVD). Next, an etching process (not shown) is performed, using the insulating layer 224 as an etching mask, thereby forming a trench 228 in the semiconductor substrate 200 exposed by the opening 226. The trench 228 is formed with a depth H which mainly penetrates a portion of the doped region 220, the doped region 216, the well region 208, and the semiconductor substrate 200. A conductive layer 230 and another conductive layer 232 are then sequentially deposited, wherein the conductive layer 230 conformably forms over surfaces of the insulating layer 224 and the bottom surface and the sidewalls of the semiconductor substrate 200 exposed by the trench 228, and the conductive layer 232 is formed over the surfaces of the conductive layer 230, thereby filling the trench 228. Next, the conductive layers 230 and 232 are patterned by using a suitable patterning mask and a patterning process (both not shown). As shown in FIG. 4, the patterned conductive layers 230 and 232 are formed over the insulating layer 224 adjacent to the trench 228, extending over the bottom surface and the sidewalls of the trench 228, thereby covering surfaces of the well region 208, and the doped regions 216, 220 exposed by the trench 228, and the conductive layers 230 and 232 also cover the gate structure G and a portion of the doped region 218 adjacent to the gate structure G. However, the conductive layers 230 and 232 do not cover the doped region 222. The portion of the conductive layers 230 and 232 formed in the trench 228 may function as a conductive contact. In one embodiment, the conductive layer 230 may comprise conductive materials such as Ti—TiN alloy, and the conductive layer 232 may comprise conductive materials such as tungsten.

Figure 5:
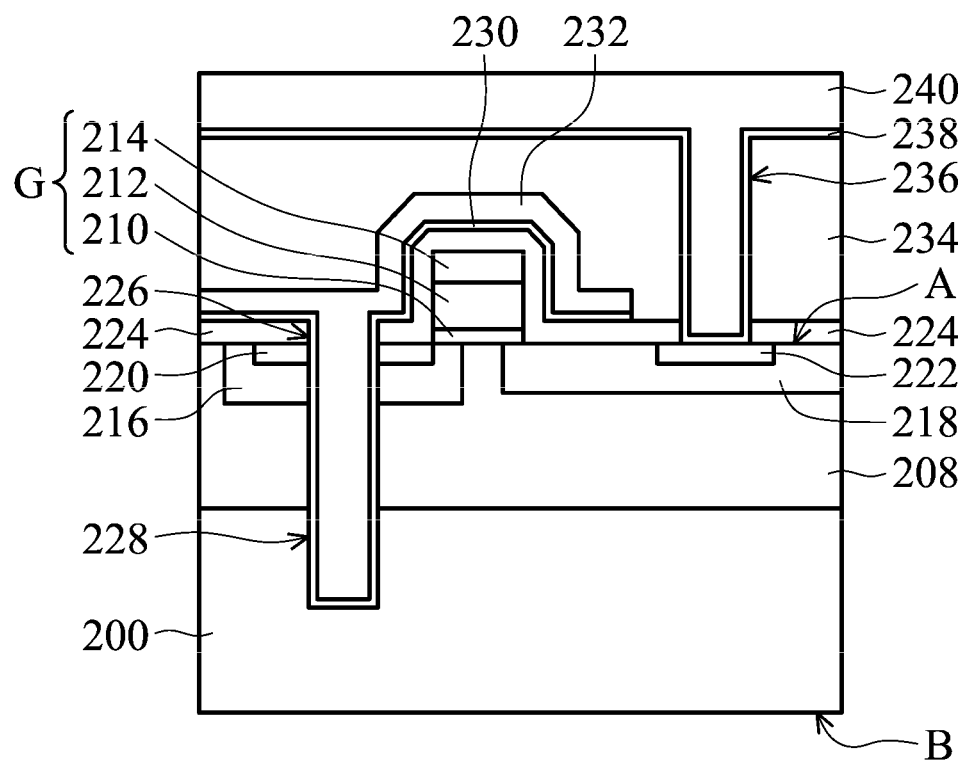

In FIG. 5, a dielectric material such as silicon oxide or spin-on-glass (SOG) is deposited over the conductive layers 230 and 232, such that the dielectric material covers the conductive layer 232, the insulating layer 224, and the gate structure G, thereby forming an inter-layer dielectric (ILD) layer 234 with a substantially planar top surface. Next, a patterning process (not shown) comprising photolithography and etching steps is performed to form a trench 236 in a portion of the ILD layer 234 and the insulating layer 224 over a portion of the doped region 222, and the trench 236 exposes a portion of the doped region 222. Next, a conductive layer 238 and another conductive layer 240 are sequentially deposited, and the conductive layer 238 conformably forms over the surfaces of the ILD layer 234 and the sidewalls exposed by the trench 236, and the conductive layer 240 is formed over the surface of the conductive layer 238, thereby filling the trench 236. The portion of the conductive layers 238 and 240 formed in the trench 236 may function as a conductive contact. In one embodiment, the conductive layer 238 may comprise conductive materials such as Ti—TiN alloy, and the conductive layer 240 may comprise conductive materials such as tungsten.

Figure 6:
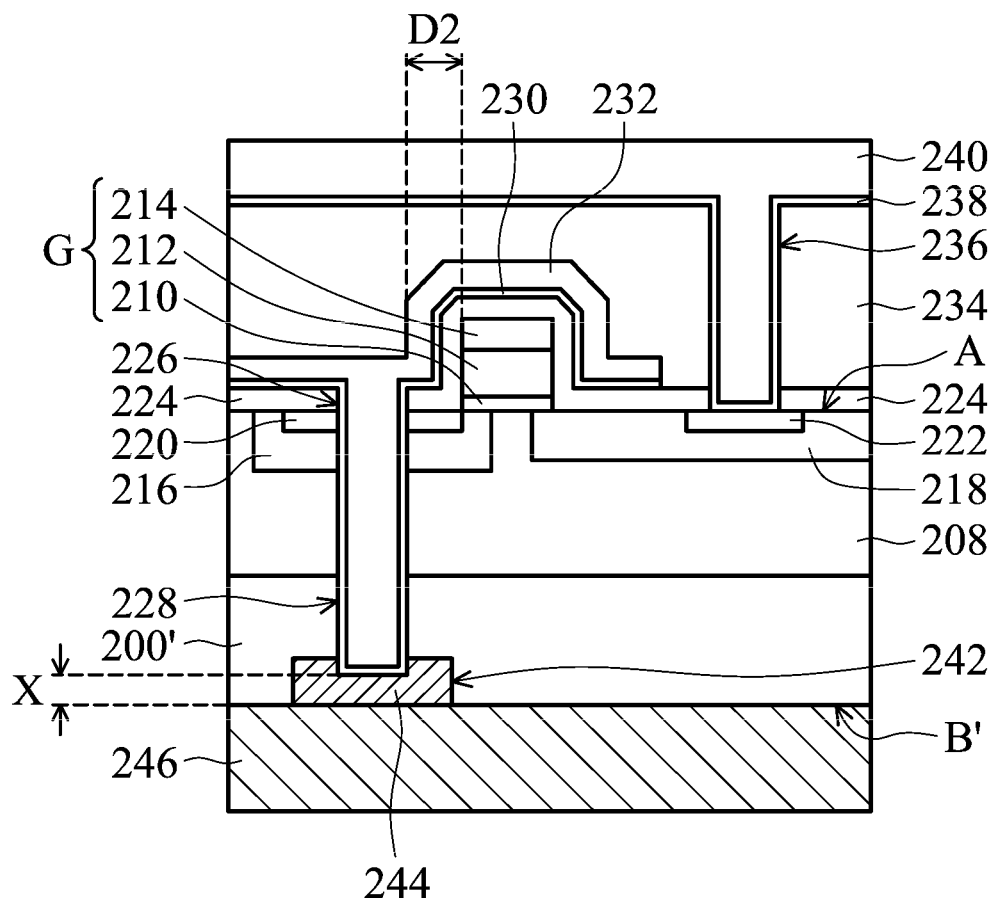

In FIG. 6, a handling substrate (not shown) is used to bond with a surface of the conductive layer 240 and then the structure shown in FIG. 5 is reversed, and a thinning process (not shown) comprising steps such as etching, polishing or combinations thereof are then performed to reduce the thickness of the semiconductor substrate 200 from the surface B thereof. Herein, after the thinning process, the thinned semiconductor substrate 200 is assigned with a reference number 200', and a thinned surface B' of the thinned semiconductor substrate 200' has a distance X to the bottom surface of the conductive layer 230 in the trench 228. In one embodiment, the distance X is about 50-300 µm.

Next, a patterning process (not shown) is performed by using a suitable patterned mask layer (not shown), thereby forming a trench 242 in the surface B' of the thinned semiconductor substrate 200', and the trench 242 exposes the bottom surface and portions of the sidewalls of the conductive layer 230. Next, a deposition process (not shown) is performed to form a conductive layer 244 in the trench 242. In one embodiment, the conductive layer 244 may comprise conductive materials such as Ti—TiN alloy, tungsten, AlCu alloy, AlSiCu alloy, and may be formed by a deposition process such as physical vapor deposition (PVD) or chemical vapor deposition (CVD). The formed conductive layer 244 may be processed by a planarization process (not shown), such that a surface of the conductive layer 244 is coplanar with the surface B' of the thinned semiconductor substrate 200. Next, another deposition process (not shown) is performed to form a blanket conductive layer 246 over the surface of the conductive layer 244 and the surface of the thinned semiconductor substrate 200'. In one embodiment, the conductive layer 246 may comprise conductive materials such as Ti—Ni—Ag alloy, and may be formed by a method such as physical vapor deposition (PVD) or chemical vapor deposition (CVD). Therefore, after removal of the handling substrate (not shown), an exemplar LDMOS device is substantially fabricated, as shown in FIG. 6.

Figure 1:
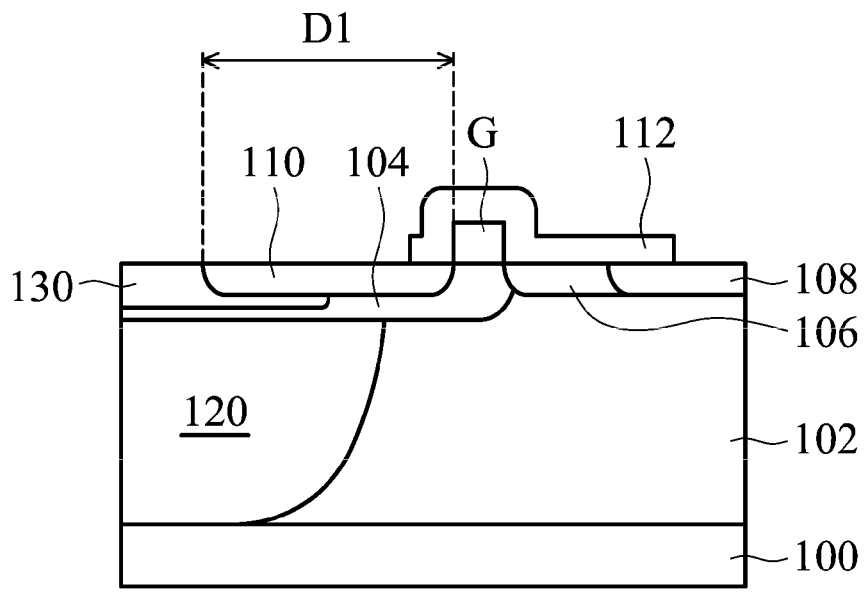
FIG. 1 is schematic cross section of a conventional lateral double diffused metal-oxide-semiconductor (LDMOS) device.

In one embodiment, the gate structure G and the doped regions 220 and 222 of the LDMOS device shown in FIG. 6 may be properly electrically connected (e.g. through conductive layers 230, 232, 238, and 240), and the regions with the first conductivity type can be P type regions, and the regions of the second conductivity type can be N type regions, such that the formed LDMOS device herein is an N type LDMOS device. At this time, the doped region 220 may function as a source region and the doped region 222 may function as a drain region. In this embodiment, during operation of the LDMOS device shown in FIG. 6, currents from the drain side (e.g. the doped region 222) may laterally flow toward the source side (e.g. doped region 220), and then arrive at the surface B' of the thinned semiconductor substrate 200' by the guidance of the doped region 216, the conductive layers 230 and 232, and the conductive layer 244, and are then dissipated by the conductive layer 246, such that undesired problems such as inductor coupling and cross-talk between adjacent circuit elements can be prevented. In this embodiment, due to the formation of the conductive layers 230 and 232 formed in the trench 228 and the conductive layer 244 embedded in the thinned semiconductor layer 200' contacting the conductive layer 246, such that ion implantation with high dosages and high energies for forming the P+ type doped region 120 as shown in FIG. 1 can be avoided, a predetermined distance D2 between the gate structure G and the doped region 234 at the right side of the trench 232 can be less than the predetermined distance D1 as shown in FIG. 1. Therefore, when compared with the N type LDMOS device as shown in FIG. 1, the N type LDMOS device shown in FIG. 6 may have the advantages of reduced size and fabrication cost, and formation of the conductive layers 244 and 246 also helps to reduce the on-state resistance (Ron) of the N type LDMOS device.

In addition, in another embodiment, the regions with the first conductivity type of the LDMOS device shown in FIG. 6 can be N type regions, and the regions of the second conductivity type can be P type regions, such that the formed LDMOS device herein can be an P type LDMOS device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral double diffused metal-oxide-semiconductor (LDMOS) device, comprising:
   a semiconductor substrate, having opposing first and second surfaces and a first conductivity type;
   a well region formed in a portion of the semiconductor substrate adjacent to the first surface thereof, having the first conductivity type;
   a gate structure disposed over a portion of the first surface of the semiconductor substrate;

a first doped region disposed in a portion of the well region adjacent to a first side of the gate structure, having the first conductivity type;

a second doped region disposed in a portion of the well region adjacent to a second side of the gate structure opposite to the first side, having a second conductivity type opposite to the first conductivity type;

a third doped region disposed in a portion of the first doped region, having the second conductivity type;

a fourth doped region disposed in a portion of the second doped region, having the second conductivity type;

a first trench formed in a portion of the third doped region, the first doped region, the well region, and the semiconductor substrate;

a conductive contact formed in the first trench;

a second trench formed in a portion of the semiconductor substrate adjacent to the second surface thereof, wherein the second trench does not penetrate the semiconductor substrate and exposes a portion of the conductive contact;

a first conductive layer formed in second trench, contacting the conductive contact; and a second conductive layer formed over the second surface of the semiconductor substrate and the first conductive layer.

2. The LDMOS device as claimed in claim 1, wherein the first conductivity type is P type and the second conductivity type is N type, or the first conductivity type is N type and the second conductivity type is P type.

3. The LDMOS device as claimed in claim 1, wherein the third doped region is a source region and the fourth doped region is a drain region.

4. The LDMOS device as claimed in claim 1, wherein the well region has a resistivity lower than a resistivity of the semiconductor substrate.

5. The LDMOS device as claimed in claim 1, wherein the conductive contact comprises a third conductive layer, and a fourth conductive layer surrounded by the third conductive layer.

6. A method for fabricating a lateral double diffused metal oxide semiconductor (LDMOS) device, comprising:

performing a semiconductor substrate, having opposite first and second surfaces and a first conductivity type;

performing an ion implantation process, forming a well region in a portion of the semiconductor substrate adjacent to the first surface thereof, having the first conductivity type;

forming a gate structure over a portion of the well region;

forming a first doped region in a portion of the well region adjacent to a first side of the gate structure, having the first conductivity type;

forming a second doped region in a portion of the well region at a second side of the gate structure opposite to the first side, having a second conductivity type opposite to the first conductivity type;

forming a third doped region in a portion of the first doped region, having the second conductivity type;

forming a fourth doped region in a portion of the second doped region, having the second conductivity type;

forming a first trench in a portion of the third doping region, the first doped region, the well region, and the semiconductor substrate;

forming a conductive contact in the first trench;

thinning the semiconductor substrate from the second surface thereof;

after thinning the semiconductor substrate, forming a second trench in a portion of the semiconductor substrate adjacent to the second surface thereof, exposing a portion of the conductive contact, wherein the second trench does not penetrate the semiconductor substrate;

forming a first conductive layer in the second trench; and forming a second conductive layer over the second surface of the semiconductor substrate and the first conductive layer.

7. The method as claimed in claim 6, wherein the first conductivity type is P type and the second conductivity type is N type, or the first conductivity type is N type and the second conductivity type is P type.

8. The method as claimed in claim 6, wherein the third doped region is a source region and the fourth doped region is a drain region.

9. The method as claimed in claim 6, wherein the well region has a resistivity lower than a resistivity of the semiconductor substrate.

10. The method as claimed in claim 6, wherein the conductive contact comprises a third conductive layer and a fourth conductive layer surrounded by the third conductive layer.

* * * * *